US007733257B1

(12) United States Patent
Lee

(10) Patent No.: US 7,733,257 B1
(45) Date of Patent: Jun. 8, 2010

(54) DIGITAL-TO-ANALOG CONVERTER HAVING EFFICIENT SWITCH CONFIGURATION

(75) Inventor: Ching-Chung Lee, Tainan County (TW)

(73) Assignee: Himax Technologies Limited, Fonghua Village, Sinshih Township, Tainan County (TW)

( * ) Notice: Subject to any disclaimer, the term of this patent is extended or adjusted under 35 U.S.C. 154(b) by 14 days.

(21) Appl. No.: 12/330,527

(22) Filed: Dec. 9, 2008

(51) Int. Cl.
*H03M 1/66* (2006.01)
(52) U.S. Cl. .................. 341/144; 341/145; 341/154
(58) Field of Classification Search .......... 341/145, 341/148, 154
See application file for complete search history.

(56) References Cited
U.S. PATENT DOCUMENTS 5,977,898 A * 11/1999 Ling et al. ............ 341/144
6,075,477 A * 6/2000 Kokubun et al. ...... 341/154
6,166,672 A * 12/2000 Park ...................... 341/145
6,246,351 B1 * 6/2001 Yilmaz ................. 341/145
7,646,321 B2 * 1/2010 Kim et al. ............. 341/145

\* cited by examiner

*Primary Examiner*—Khai M Nguyen
(74) *Attorney, Agent, or Firm*—Winston Hsu

(57) ABSTRACT

A DAC includes a gamma voltage generator for generating a plurality of gamma voltages, and a decoder for receiving an M-bit digital value for selecting one of the gamma voltages, wherein the decoder comprises a first thermometer encoder, a first selector and a second selector. The first thermometer encoder is utilized to receive N bits of the digital value to generate a first thermometer code with $2^N$ bits, wherein N is smaller than M, and M and N are positive integers. The first selector has a plurality of selecting groups, each selecting group having $2^N$ switches controlled by the first thermometer code to output one gamma voltage, where the second selector receives the gamma voltages outputted by the selecting groups of the first selector and outputs one gamma voltage selected from the received gamma voltages based on the (M−N) bit of the digital value.

5 Claims, 6 Drawing Sheets

US 7,733,257 B1

DIGITAL-TO-ANALOG CONVERTER HAVING EFFICIENT SWITCH CONFIGURATION

BACKGROUND OF THE INVENTION

1. Field of the Invention

The present invention relates to a digital-to-analog converter (DAC) configuration, and more particularly, to a DAC that uses fewer switches and has a more efficient circuit configuration.

2. Description of the Prior Art

As shown in FIG. 1, a conventional DAC 100 is formed by a resistor string 110 and a plurality of binary selectors 120. The resistor string 110 is electrically connected between a first voltage level $V_1$ and a second voltage level $V_2$ so that each terminal of the resistors in the string 110 has a specific and different voltage level. Each binary selector 120 includes two switches 122 and 124 respectively controlled by a binary bit and its inverse. The switch that corresponds to the bit having a value equal to '1' will be switched on, while another switch that corresponds to the bit having a value equal to '0' will be switched off. Please refer to FIG. 2, which shows an example illustrating how the DAC 100 converts a digital value '$b_0\ b_1\ b_2\ b_3$' into an analog value. The binary selectors 120 are arranged in four stages, wherein the binary selectors 120 in the first stage are controlled by the first bit $b_0$ and its inverse $b_{0b}$, the binary selectors 120 in the second stage are controlled by the second bit $b_1$ and its inverse bib, and so on. When the input digital value is '0011', the switches of the binary selectors 120 controlled by $b_{0b}$, $b_{1b}$, $b_2$ and $b_3$ are turned on, generating a conducting path that couples the output of the DAC 100 to the target terminal in the resistor string 110. The DAC 100 therefore transforms the digital value '0011' into an analog value, i.e. the voltage level at the target terminal.

As can be seen, the conventional DAC requires 30 switches to convert a digital value with 4 bits. In general, to convert n-bit digital value, $2\times(2^n-1)$ switches are needed. As the bit number of the digital value increases, the number of switches required grows significantly, resulting in increases of chip area and power consumption for the DAC.

SUMMARY OF THE INVENTION

One objective of the present invention is therefore to provide a DAC that uses fewer switches and has more efficient circuit configuration. When the DAC is implemented in a source driver of a liquid crystal display (LCD) device, the gamma coupling and power consumption can both be reduced.

According to one exemplary embodiment of the present invention, a DAC is provided. The DAC comprises a gamma voltage generator for generating a plurality of gamma voltages, and a decoder for receiving an M-bit digital value to select one of the gamma voltages, wherein the decoder comprises a first thermometer encoder, a first selector and a second selector. The first thermometer encoder is utilized to receive N bits of the digital value to generate a first thermometer code with $2^N$ bits, wherein N is smaller than M, and M and N are positive integers. The first selector has a plurality of selecting groups, each selecting group having $2^N$ switches controlled by the first thermometer code to output one gamma voltage, where the second selector receives the gamma voltages outputted by the selecting groups of the first selector and outputs one gamma voltage selected from the received gamma voltages based on the (M−N) bit of the digital value.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
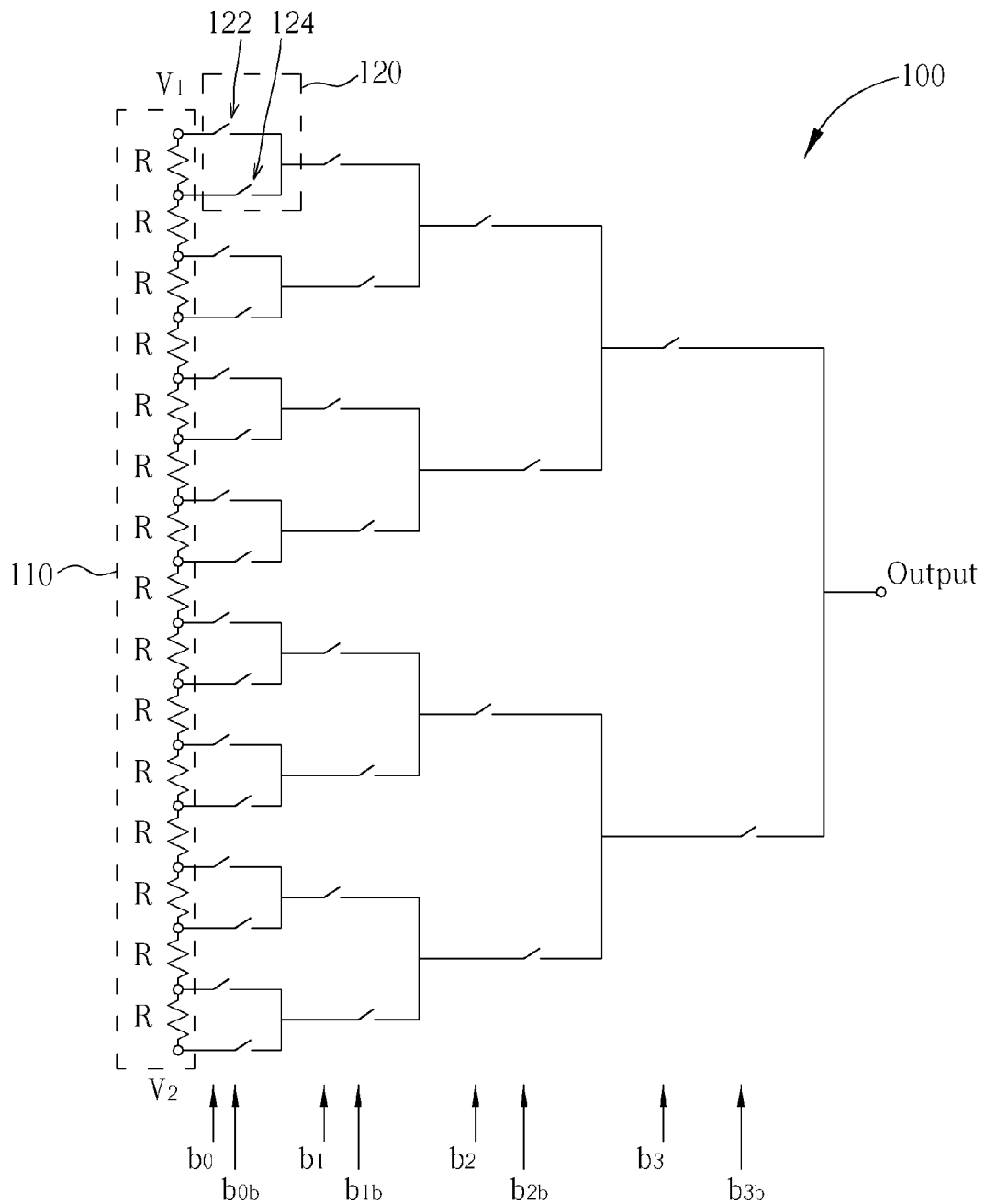
FIG. 1 shows a diagram of a conventional DAC formed by a resistor string and a plurality of binary selectors.
Figure 2:
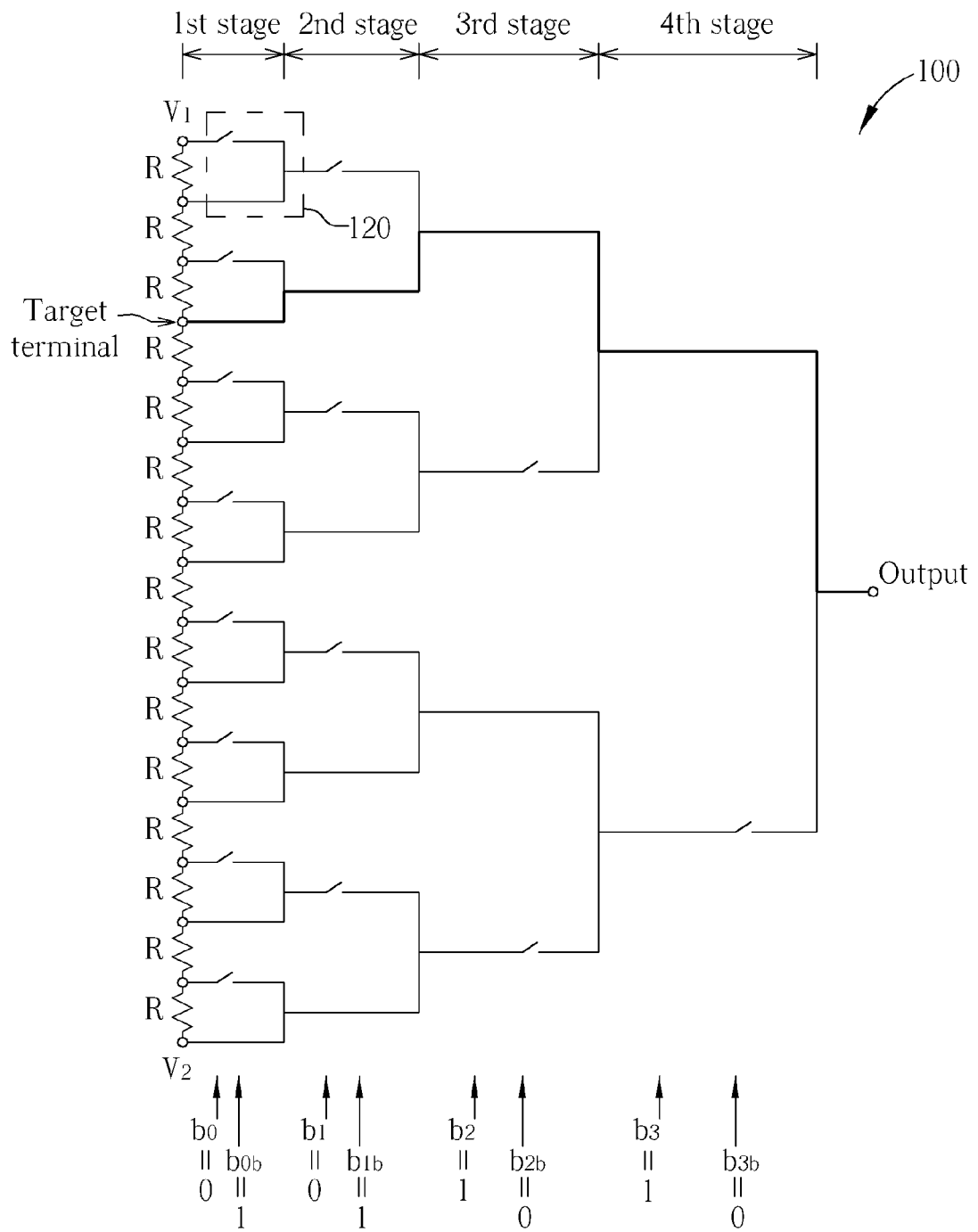
FIG. 2 is a diagram showing how the DAC in FIG. 1 converts a digital value '$b_0\ b_1\ b_2\ b_3$' into an analog value.
Figure 3:
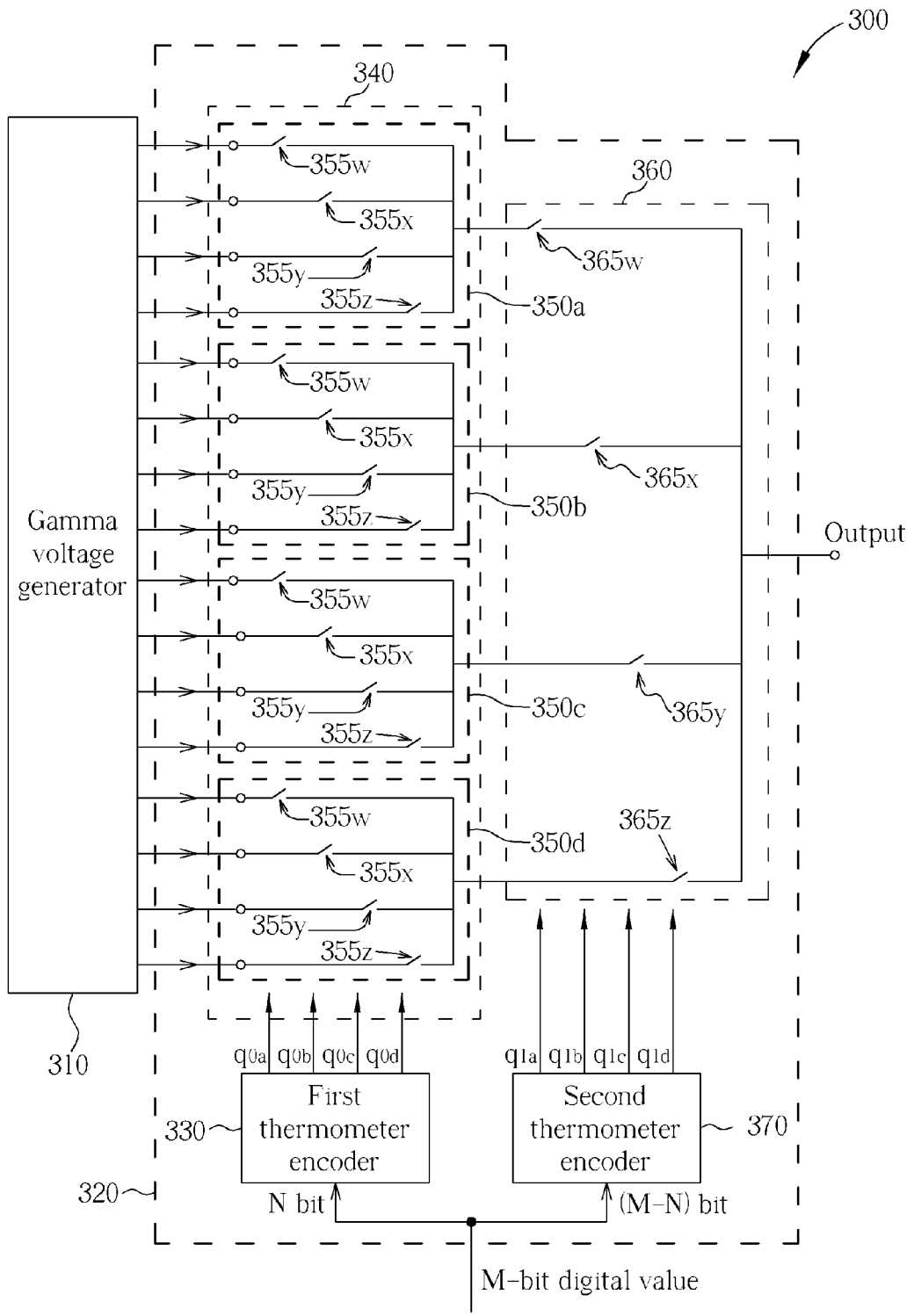
FIG. 3 shows a diagram of a DAC structure according to one exemplary embodiment of the present invention.

Please refer to FIG. 3, which shows a diagram of a DAC structure according to one exemplary embodiment of the present invention. The DAC 300 comprises a gamma voltage generator 310 utilized for generating a plurality of gamma voltages, and a decoder 320 utilized for receiving a M-bit digital value and selecting one of the gamma voltages according to the digital value, thereby converting the digital value into an analog gamma voltage at the output end of the DAC 300. The gamma voltage generator 310 can be, but is not limited to, the resistor string 110 that is coupled between two voltage levels $V_1$ and $V_2$ shown in FIG. 1.

The decoder 320 comprises a first selector 340 and a second selector 360, wherein in this embodiment, the first selector 340 and the second selector 360 are formed by selecting groups each having a plurality of switches whose output terminals are connected directly together. In one embodiment, the first selector 340 comprises four selecting groups 350a, 350b, 350c and 350d, and each selecting group comprises 4 switches 355w, 355x, 355y, and 355z. The second selector 360 comprises one selecting group comprising 4 switches 365w, 365x, 365y, and 365z. Please note that the number of the selecting group in the first and second selectors 340 and 360, and the number of the switches in one selecting group are not limited. FIG. 3 only shows an embodiment and is not meant to be a limitation. The switch 355(365) may be implemented by an NMOS or PMOS, depending on the system requirement.

Different from the prior arts, the first selector 340 is controlled by a first thermometer code '$q_{0a}\ q_{0b}\ q_{0c}\ q_{0d}$' generated from encoding part of the M-bit digital value, while the second selector 360 is controlled by a second thermometer code '$q_{1a} q_{1b} q_{1c} q_{1d}$' generated from encoding the other part of the M-bit digital value. Switches 355w, 355x, 355y, and 355z are respectively controlled by $q_{0a}$, $q_{0b}$, $q_{0c}$, and $q_{0d}$, while switches 365w, 365x, 365y, and 365z are respectively controlled by $q_{1a}$, $q_{1b}$, $q_{1c}$, and $q_{1d}$. More specifically, the switch 355w in every selecting group 350a-350d is controlled by the first bit $q_{0a}$ of the first thermometer code, the switch 355x in every selecting group 350a-350d is controlled by the second bit $q_{0b}$, and so on. For example, when the switch 355w is implemented by a NMOS, it will be turned on if the value of $q_{0a}$ equals to '1' (i.e. high voltage level), and will be turned off if the value of $q_{0a}$ equals to '0' (i.e. low voltage level). As can be seen, the number of switches in one selecting group and the bit number of a thermometer code are related to each other.

The encoding is performed by a first thermometer encoder 330 and a second thermometer encoder 370. In this embodiment, the first thermometer encoder 330 receives N bits of the digital value (for example, the least significant N bits of the digital value), and encodes it to generate the first thermometer code with $2^N$ bits, where N is smaller than M and is a positive integer; the second thermometer encoder 370 receives the rest (M−N) bits of the digital value (for example, the most significant (M−N) bits if the digital value), and encodes it to generate the second thermometer code with $2^{(M-N)}$ bits.

For convenience of illustration, the input digital value has 4 bits in this embodiment (i.e. M=4), the first thermometer encoder 330 receives 2 bits (N=2) of the digital value to generate the first thermometer code with 4 bits '$q_{0a} q_{0b} q_{0c} q_{0d}$', and the second thermometer encoder 370 receives the other 2 bits of the digital value to generate the second thermometer code with 4 bits '$q_{1a} q_{1b} q_{1c} q_{1d}$'. In one embodiment, the input digital value is represented by '$b_0 b_1 b_2 b_3$', and the first thermometer encoder 330 receives two bits $b_0$ and $b_1$, and generates the first thermometer code '$q_{0a} q_{0b} q_{0c} q_{0d}$' based on the following equations:

$q_{0a}=\text{AND}(b_{0b}, b_{1b})$, $q_{0b}=\text{AND}(b_0, b_{1b})$, $q_{0c}=\text{AND}(b_{0b}, b_1)$, $q_{0d}=\text{AND}(b_0, b_1)$ where $b_{0b}$ represents the inverse value of $b_0$, and $b_{1b}$ represents the inverse value of $b_1$. Similarly, the second thermometer encoder 370 receives two bits $b_2$ and $b_3$, and generates the second thermometer code '$q_{1a} q_{1b} q_{1c} q_{1d}$' based on the following equations:

$q_{1a}=\text{AND}(b_{2b}, b_{3b})$, $q_{1b}=\text{AND}(b_2, b_{3b})$, $q_{1c}=\text{AND}(b_{2b}, b_3)$, $q_{1d}=\text{AND}(b_2, b_3)$ where $b_{2b}$ represents the inverse value of $b_2$, and $b_{3b}$ represents the inverse value of $b_3$.

Please note that the above equations are for illustrative purposes only and are not meant to be limitations of the present invention. Other encoding algorithms can also be used as long as the encoding algorithms can generate a code '$q_{0a} q_{0b} q_{0c} q_{0d}$' where only one bit ($q_{0a}$, $q_{0b}$, $q_{0c}$, or $q_{0d}$) of the code has a value equal to '1' if the switches 355 are implemented by NMOSs, or generate a code where only one bit of the code has a value equal to '0' if the switches 355 are implemented by PMOSs. Therefore, only one switch will be turned on in one selecting group: each selecting groups 350a-350d in the first selector 340 will output one gamma voltage, and the second selector 360 receives the gamma voltages outputted by the selecting groups 350a-350d and outputs one gamma voltage selected from the received gamma voltages. Only a single conducting path in the decoder 300 that couples the output of the DAC 300 to a unique target gamma voltage will be formed.

Figure 4:
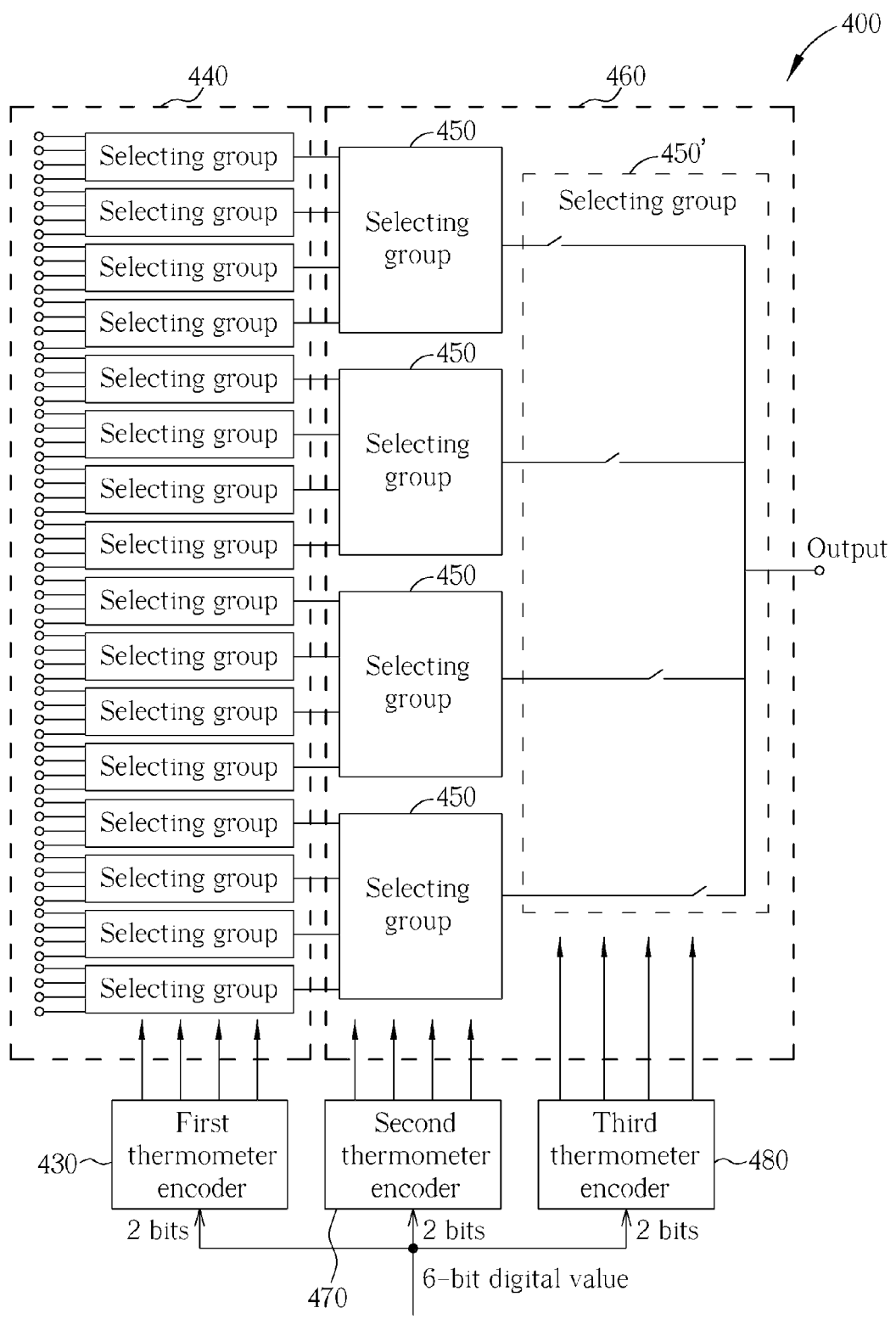
FIG. 4 shows a diagram of a DAC structure according to another exemplary embodiment of the present invention.

In this way, the number of switches required by the DAC 300 is reduced from $2\times(2^n-1)$ to $4/3\times(2^n-1)$, which is approximately a 33% reduction. The immediate advantages caused by the reduction are smaller chip area, power consumption, and gamma coupling. As the bit number of the input digital value increases, the advantages of the present invention become more obvious when compared to the prior arts. FIG. 4 shows a diagram of a DAC 400 structure for converting an input digital value with 6 bits according to one exemplary embodiment of the present invention. The DAC 400 uses three thermometer encoders 430, 470, and 480 to encode the input digital value in order to generate three thermometer codes. Please note that the selecting group hereinafter represents the structure of the selecting group 350 mentioned above, which has $2^N$ switches (e.g. 4 switches) and each of which is controlled by a bit of a thermometer code with $2^N$ bits to output one gamma voltage. The first selector 440 comprises 16 selecting groups controlled by a first thermometer code generated by encoding two bits of the input digital value. The second selector 460 comprises 5 selecting groups arranged in two stages, wherein 4 selecting groups 450 arranged in the prior stage are controlled by a second thermometer code generated by encoding another two bits of the input digital value, and the selecting group 450' arranged in the last stage is controlled by a third thermometer code generated by encoding the other two bits of the input digital value. The total switch number in the DAC 400 is 84 (64 for the first selector 440, 16 for the prior stage of the second selector 460, and 4 for the last stage of the second selector 460); however, the switch number required for the conventional DAC 100 to convert the 6-bit digital value is 126 (64+32+16+8+4+2). A significant efficiency improvement is obtained.

Figure 5:
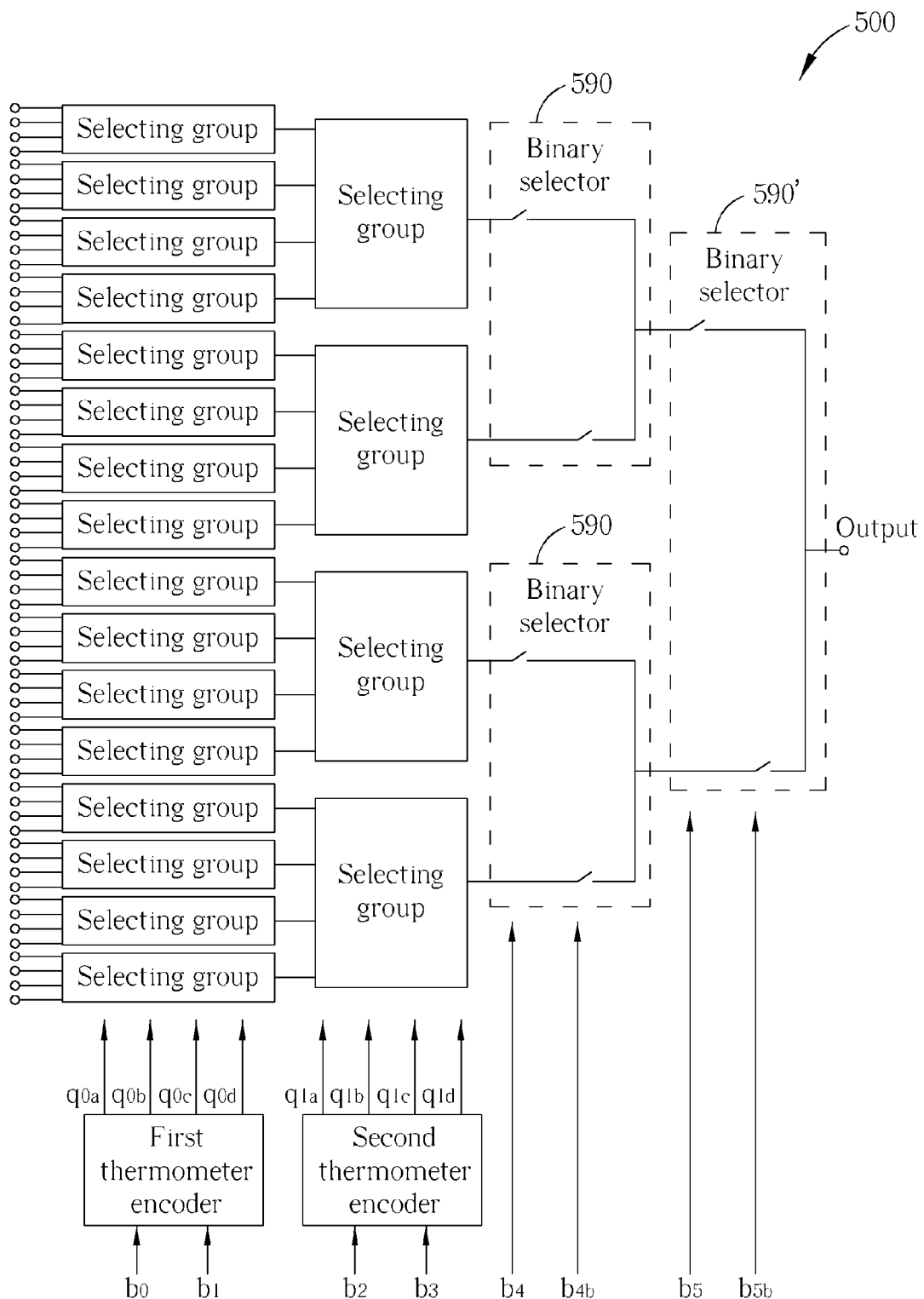
FIG. 5 shows a diagram of a DAC structure according to another exemplary embodiment of the present invention.

A hybrid configuration is provided in FIG. 5. In this embodiment, the selecting group 450' in the last stage of the second selector 460 is replaced by three binary selectors 590 and 590'. The binary selector 590 outputs the voltage received from either of its two input terminals based on a binary bit. In this embodiment, the binary selectors 590 in a prior stage are controlled by the fifth bit $b_4$ of the digital value and its inverse bob, and the binary selector 590' in a last stage is controlled by the last bit $b_5$ of the digital value and its inverse $b_{5b}$. Although the switch number required in the DAC 500 is slightly more than that in the DAC 400 (the DAC 500 needs 86 switches), it is still less than that required in the conventional DAC 100. The advantages of reduced chip area, power consumption, and gamma coupling are also available in this embodiment.

Figure 6:
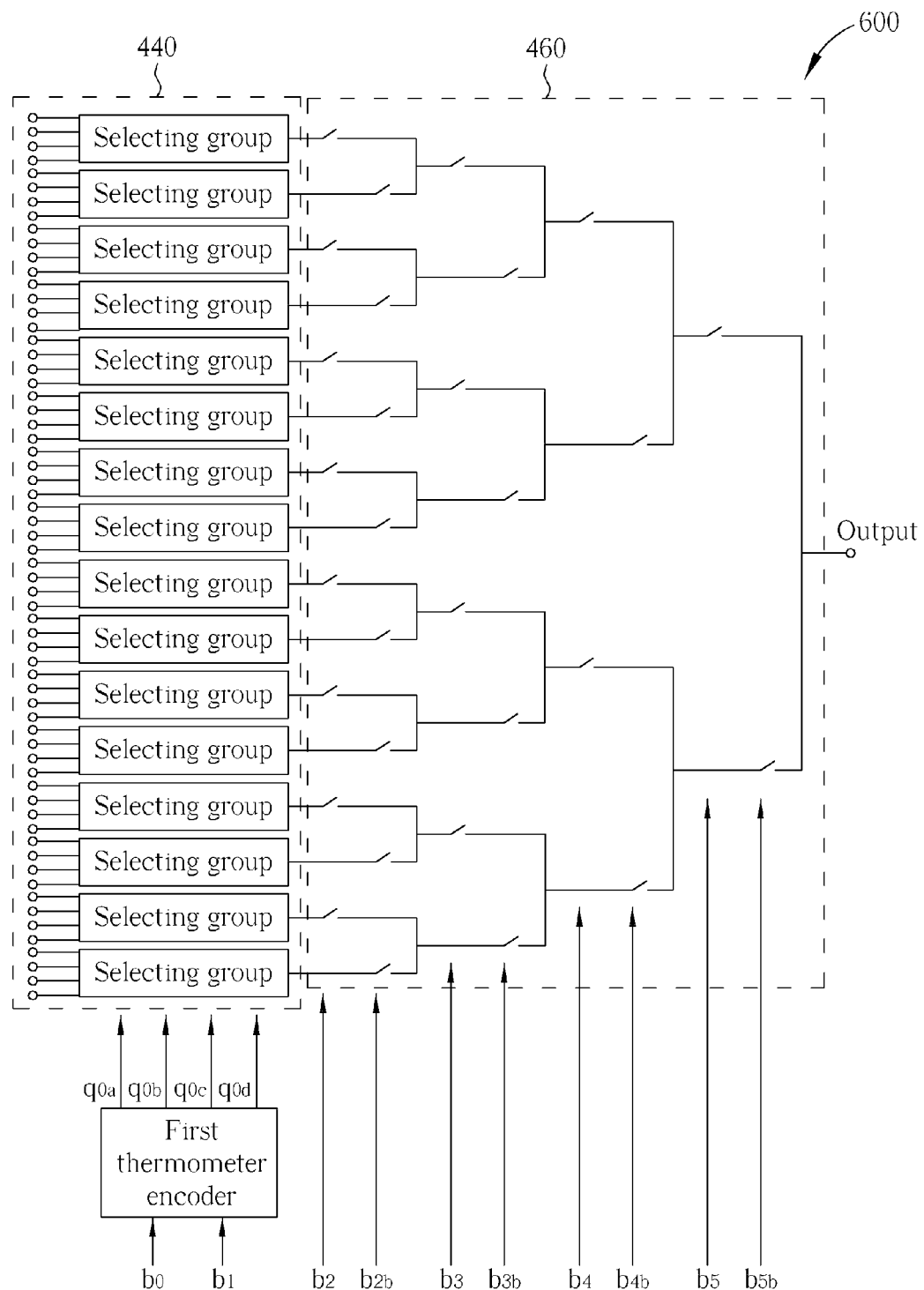
FIG. 6 shows a diagram of a DAC structure according to another exemplary embodiment of the present invention.

In another embodiment where the second selector 460 is formed by binary selectors, as shown in FIG. 6, the binary selectors are arranged in four stages, and binary selectors in a same stage are controlled by a same bit of the digital value ($b_2$, $b_3$, $b_4$, or $b_5$ in this embodiment). This structure 600 requires 94 switches, which is approximately a 25% reduction as compared with the conventional DAC 100. The reduction results from the first selector 440 adopting selecting-group configuration. According to the above embodiments, it is profitable to use the selecting-group configuration or the hybrid configuration that mixes the selecting groups with binary selectors to improve system design flexibility in the DAC. For the hybrid configuration, it is preferred to dispose selecting groups rather than binary selectors in the prior stages coupled to the gamma voltage generator since this arrangement can save more switches.

When the DAC in the above embodiments is implemented in a source driver of a LCD device for converting digital display data into analog display data that is used to drive a panel of the LCD device, the chip area, the gamma coupling and power consumption can all be reduced. As the bit number of the input digital value to be converted increases, the advantages of the DAC become more obvious. Furthermore, the scope of the present invention should be extended to the DAC formed by slightly modifying the DACs shown in the above embodiments; for example, the selecting group may have 3 switches or more than 4 switches within, and the switch number of each selecting group may not be the same (for example, switches may be controlled by more than one bit of the thermometer code or the digital value, or some bits of the thermometer code may be idle and not utilized to control the turning on/off of switches).

Those skilled in the art will readily observe that numerous modifications and alterations of the device and method may be made while retaining the teachings of the invention.

What is claimed is:

1. A digital-to-analog converter comprising:
    a gamma voltage generator for generating a plurality of gamma voltages; and
    a decoder for receiving an M-bit digital value to select one of the gamma voltages, the decoder comprising:
        a first thermometer encoder for receiving N bits of the digital value to generate a first thermometer code with $2^N$ bits, wherein N is smaller than M, and M and N are positive integers;
        a second thermometer encoder for receiving K bits of the (M−N) bits of the digital value except the N bits inputted into the first thermometer encoder to generate a second thermometer code with $2^K$ bits, wherein K is smaller than or equal to (M−N), and is a positive integer;
        a first selector having a plurality of selecting groups, each selecting group having $2^N$ switches being controlled by the first thermometer code to output one gamma voltage; and
        a second selector comprising a plurality of selecting groups, each selecting group has $2^K$ switches controlled by the second thermometer code to receive gamma voltages outputted from the first selector and output one gamma voltage selected from the received gamma voltages according to the second thermometer code.

2. The digital-to-analog converter of claim 1, wherein the second selector comprises a plurality of binary selectors arranged in one stage.

3. The digital-to-analog converter of claim 1, wherein the decoder further comprises at least one third thermometer encoder for receiving R bits of the (M−N-K) bits of the digital value except the N bits inputted into the first thermometer encoder and the K bits inputted into the second thermometer encoder to generate a third thermometer code with $2^R$ bits, wherein R is smaller than or equal to (M−N−K), and is a positive integer.

4. The digital-to-analog converter of claim 1, wherein the second selector further comprises a plurality of binary selectors arranged in a plurality of stages, and binary selectors in a same stage are controlled by a same bit of the (M−N−K) bit of the digital value except the N bits inputted into the first thermometer encoder and the K bits inputted into the second thermometer encoder.

5. The digital-to-analog converter of claim 1, implemented in a source driver of an LCD device.

* * * * *